United States Patent
Yoo et al.

(10) Patent No.: US 7,718,554 B2
(45) Date of Patent: *May 18, 2010

(54) FOCUSED LASER BEAM PROCESSING

(75) Inventors: Woo Sik Yoo, Palo Alto, CA (US);
Kitaek Kang, Dublin, CA (US)

(73) Assignee: Wafermasters, Inc., San Jose, CA (US)

( * ) Notice: Subject to any disclaimer, the term of this patent is extended or adjusted under 35 U.S.C. 154(b) by 614 days.

This patent is subject to a terminal disclaimer.

(21) Appl. No.: 11/673,306

(22) Filed: Feb. 9, 2007

(65) Prior Publication Data

US 2008/0191121 A1 Aug. 14, 2008

(51) Int. Cl.
*H01L 21/26* (2006.01)
*H01L 21/42* (2006.01)
*H01L 21/324* (2006.01)
*H01L 21/477* (2006.01)
*H01L 21/331* (2006.01)

(52) U.S. Cl. ............................ 438/795; 438/16; 438/72; 438/318

(58) Field of Classification Search .................. 438/795, 438/463, 7, 487, 535, 662, 940, 16, 72, 318
See application file for complete search history.

(56) References Cited

U.S. PATENT DOCUMENTS 7,295,307 B2 * 11/2007 Naka et al. .................. 356/301
2008/0192250 A1 * 8/2008 Yoo et al. .................... 356/326

* cited by examiner

*Primary Examiner*—Chuong A. Luu
(74) *Attorney, Agent, or Firm*—Haynes and Boone, LLP

(57) ABSTRACT

Methods and systems for processing semiconductor materials with a focused laser beam. Laser light may be focused on a sample to alter material properties at the sample surface. The laser beam has a peak power, a pulse width and is modulated to a selected duty cycle to provide a selected energy per pulse and average power to the sample surface. The focused laser beam is scanned over the sample surface to provide controlled process effects limited to the area of the beam diameter and along the scanning path. For example, process effects such as curing, annealing, implant activation, selective melting, deposition and chemical reaction may be achieved at dimensions limited by the focused beam diameter. The wavelength may be selected to be appropriate for the process effect chosen.

25 Claims, 5 Drawing Sheets

FOCUSED LASER BEAM PROCESSING

BACKGROUND

1. Field of Invention

This disclosure generally relates to processing of semiconductor substrates with a focused laser beam.

2. Related Art

Focused laser beams have found applications in drilling, scribing, and cutting of semiconductor wafers, such as silicon. Marking and scribing of non-semiconductor materials, such as printed circuit boards and product labels are additional common applications of focused laser beams. Microelectromechanical systems (MEMS) devices are laser machined to provide channels, pockets, and through features (holes) with laser spot sizes down to 5 µm and positioning resolution of 1 µm. Channels and pockets allow the device to flex. All such processes rely on a significant rise in the temperature of the material in a region highly localized at the laser beam point of focus.

The foregoing applications, however, are all, to some degree, destructive, and relate generally to focused laser beams at power densities intended to ablate material. In silicon and related semiconductor and electronic materials, such applications are generally for mechanical results (e.g., dicing, drilling, marking, etc.). Thus, there is a need to provide and control laser beams to achieve processing effects for electronic and or optical device fabrication on semiconductor wafers.

SUMMARY

Methods and systems of semiconductor material and device processing with focused laser beams are disclosed. Specifically, in accordance with an embodiment of the disclosure, a method of processing semiconductor materials includes providing a laser beam of a selected wavelength and a selected peak power. The laser beam is modulated to provide pulses of a discrete time pulse width. The laser beam is focused at the surface plane of the semiconductor material. The total energy in each laser pulse is controlled to a selected value. The laser beam is scanned over the surface of the semiconductor material in a programmed pattern. Device fabrication is accomplished by altering material electronic and/or optical properties and features at the surface of the semiconductor material.

BRIEF DESCRIPTION OF THE DRAWINGS

Like reference symbols in the various drawings indicate like elements.

DETAILED DESCRIPTION

Figure 1:
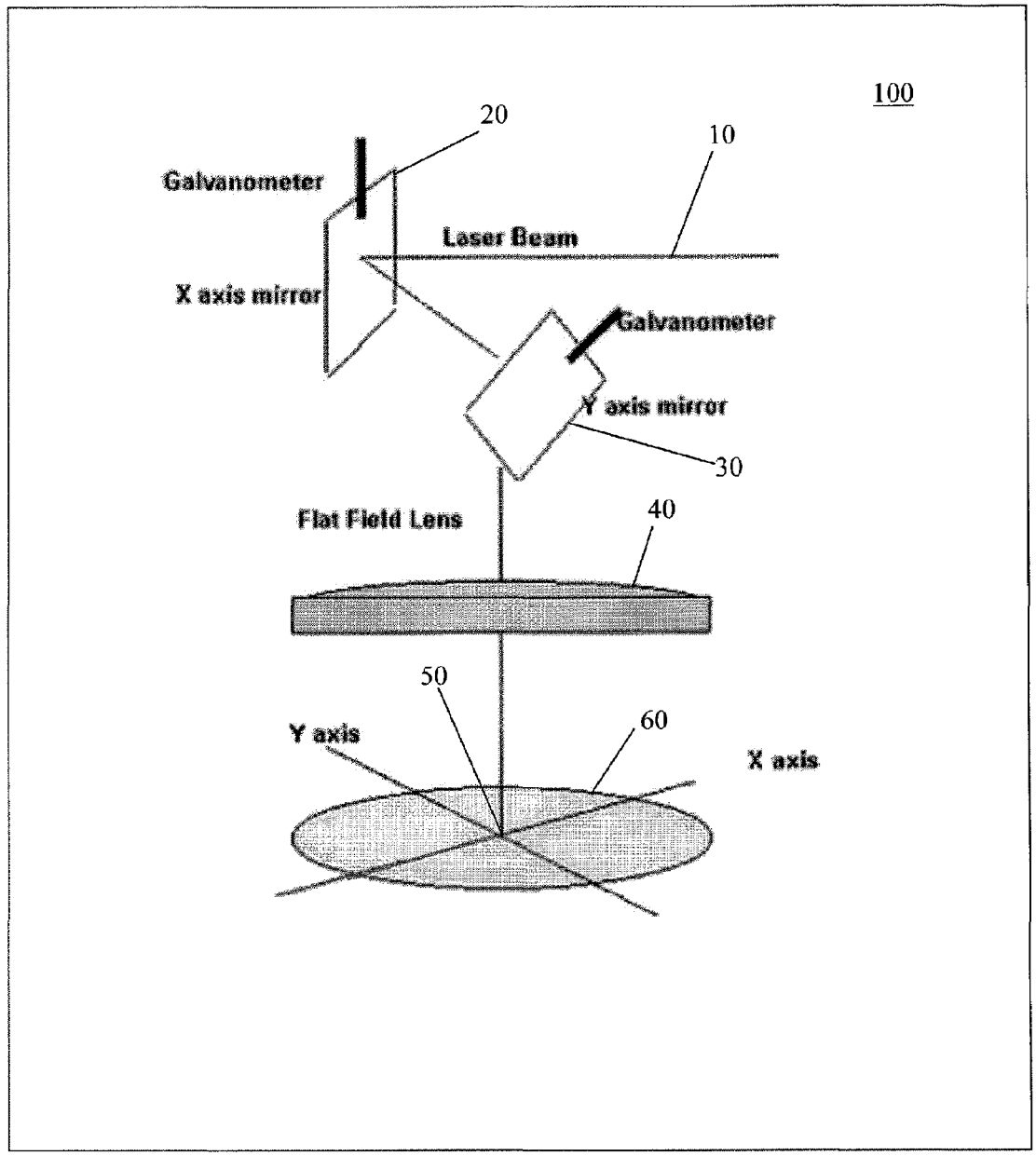
FIG. 1 is a drawing of a galvanometric beam scanner, in accordance with an embodiment of the disclosure.

FIG. 1 is a drawing of a galvanometric beam substrate scanning system 100 for directing a focused laser beam at a semiconductor substrate during a processing step of device manufacturing. A collimated laser beam 10 is directed to a first mirror galvanometer 20 configured to scan laser beam 10, for example, in an axial direction about a first axis. Laser beam 10 is then directed toward a second mirror galvanometer 30 configured to scan laser beam 10, for example, in an axial direction about a second axis, which is perpendicular to the first axis. The effect of the two galvanometer mirrors 20 and 30 is to scan laser beam 10 in perpendicular X and Y directions in the plane of a semiconductor substrate 60. Laser beam 10 is directed by the combination of mirror galvanometers 20 and 30 through a flat field focusing lens 40. The function of flat field lens 40 is to bring laser beam 10 to a focused spot 50 at the surface of semiconductor substrate 60 with minimum distortion of the focused beam across the entire area to be scanned. Lens 40 may be a single lens or, alternatively a compound system of lenses configured to accomplish the same objective. Programmable controls (not shown) of mirror galvanometers 20 and 30 then position focused spot 50 at specified locations on substrate 60.

Figure 2:
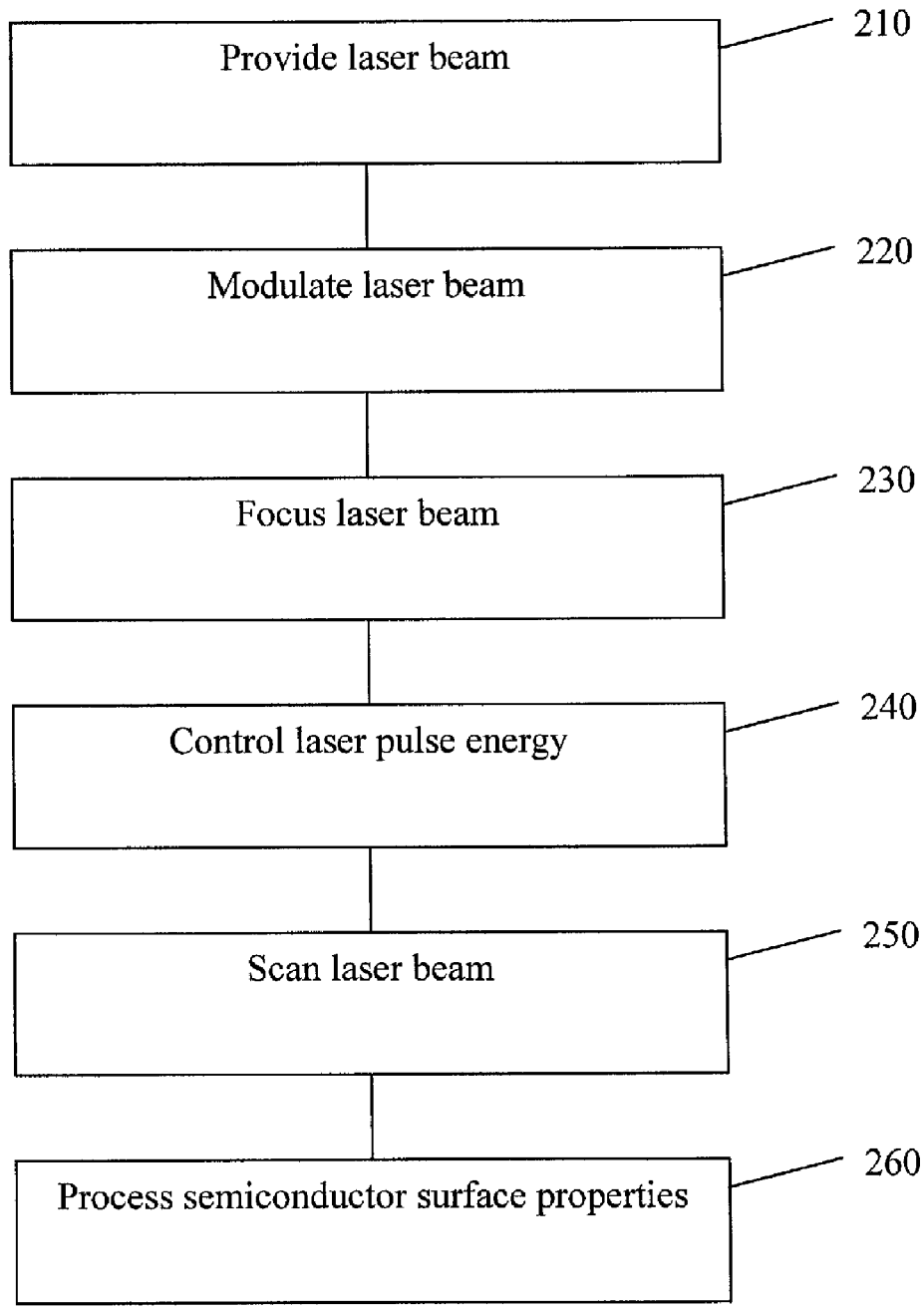
FIG. 2 is a diagram of the method of processing semiconductor materials and devices in accordance with an embodiment of the disclosure.

FIG. 2 is a diagram of the method of laser processing 200 semiconductor materials and devices in accordance with an embodiment of the disclosure. Laser beam 10, as provided in block 210, may be selected to have a wavelength appropriate to the process application. For many such possible applications, the wavelength may range, for example, from 140 nanometers to 3 microns; however, wavelengths beyond this range may be useful for some processes. Laser beam 10 may be continuous or, alternatively, it may be pulsed. Regardless, laser beam 10 may require a selected peak power to meet the requirements of a particular process application.

For the required application, laser beam 10 may be appropriately modulated (block 220). Modulation may include providing pulses of laser light where the pulse width may range from approximately 10 femtoseconds to approximately 100 milliseconds, depending on the process application. A pulse repetition rate may be selected to provide laser energy to the surface of the semiconductor substrate at a selected average power and peak pulse power. The selected average power is generally the product of the pulse width times the peak power times the fraction corresponding to a selected duty cycle, assuming the peak power is constant over the length of the pulse. The duty cycle is the percentage corresponding to the fraction of the pulse width divided by the period corresponding to the pulse repetition rate, where the period is the inverse of the pulse repetition rate.

Laser beam 10 may then be focused (block 230) to a preferred beam diameter at a focal plane containing semiconductor substrate 60 with flat field lens 40. Depending on the application, the preferred beam diameter may range from approximately 0.1 micron to 1 millimeter. The "spot" size is dependent on the wave length, the lens aperture, and the optical configuration of the lens relative to the substrate. Lens 40, or in the case of a compound lens optical system, is shown disposed between the system of mirror galvanometers 20 and 30, but may also be disposed elsewhere in the optical beam system.

The beam diameter may be defined in a variety of ways, all of which may substantially serve as definitions of beam diameter. For a circular beam having a Gaussian profile of intensity, one typical definition specifies the beam diameter according to the radial distance from the beam center at which the power density drops to $1/e^2$ of the power density at the beam center, where e is the natural logarithm base. Another definition, for example, where the intensity of a circular beam is substantially constant over the aperture of the spot size, is the radial distance at which the power density drops to a given percentage of the central power density, such as 50% or 10%. Other definitions of beam diameter may also be acceptable, in accordance with the embodiment of the disclosure. The ultimate requirement is to provide sufficient thermal heating in a highly localized region of the semiconductor substrate or sample, at the surface and to a controlled but sufficient depth, to produce the desired process effect.

The total energy in a single laser pulse is generally the product of the peak power and the pulse width, assuming the power is constant over the pulse width. The total energy in a single laser pulse may be controlled (block 240) by selecting a combination of peak power and pulse width. A typical range of total pulse energy may extend from approximately 1 micro-Joule to 1 Joule, but various process applications may require higher or lower total impulse energy. It is worth noting, as a matter of practicality, when peak laser energy is too low, the thermal conductivity of the semiconductor substrate and any fixture supporting it may result in a negligible rise in temperature. Therefore, peak laser power must be able to overcome thermal conductivity effects to the extent sufficient for the process application. A discussion of the effect of laser pulse width is included below.

Laser beam 10, is directed to scan (block 250) substrate 60 by actuation of mirror galvanometers 20 and 30. The area scanned may range from 7840 nanometer$^2$—on the order of a single focused laser spot 50—to about 400 cm$^2$, potentially the entire area of substrate 60. Scanning may occur over one section of substrate 60 at a time, and may be repeated as necessary, or it may occur over the entire substrate in a single programmed scanning path. It may be advantageous to scan a limited segment area of substrate 60 and then reposition substrate 60, with the aid of a substrate processing station (described below) adapted to translate the location of substrate 60 for a successive scan of another area. In this way, distortions of the optical beam, and consequent degradation of focused spot 50 resulting from large angular excursion that may be required of mirror galvanometers 20 and 30 may be avoided by restricting the scanned field of view required, thereby improving accuracy and uniformity of process performance. Between scanning segments, laser beam 10 may be blocked or otherwise terminated so as not to cause any process effects to occur on substrate 60 in undesirable locations. Alternatively, an entire substrate may be scanned by simultaneous combination of beam scanning and substrate translation.

A large variety of process effects may be accomplished (block 260) using laser beam 10 as focused spot 50. These may include annealing, implant activation, dopant diffusion control, deposition, thin film formation, chemical reaction, curing, baking, and other forms of material modification. The spatial extent to which these effects are achieved may be critically controlled by the size of focused spot 50.

Figure 3:
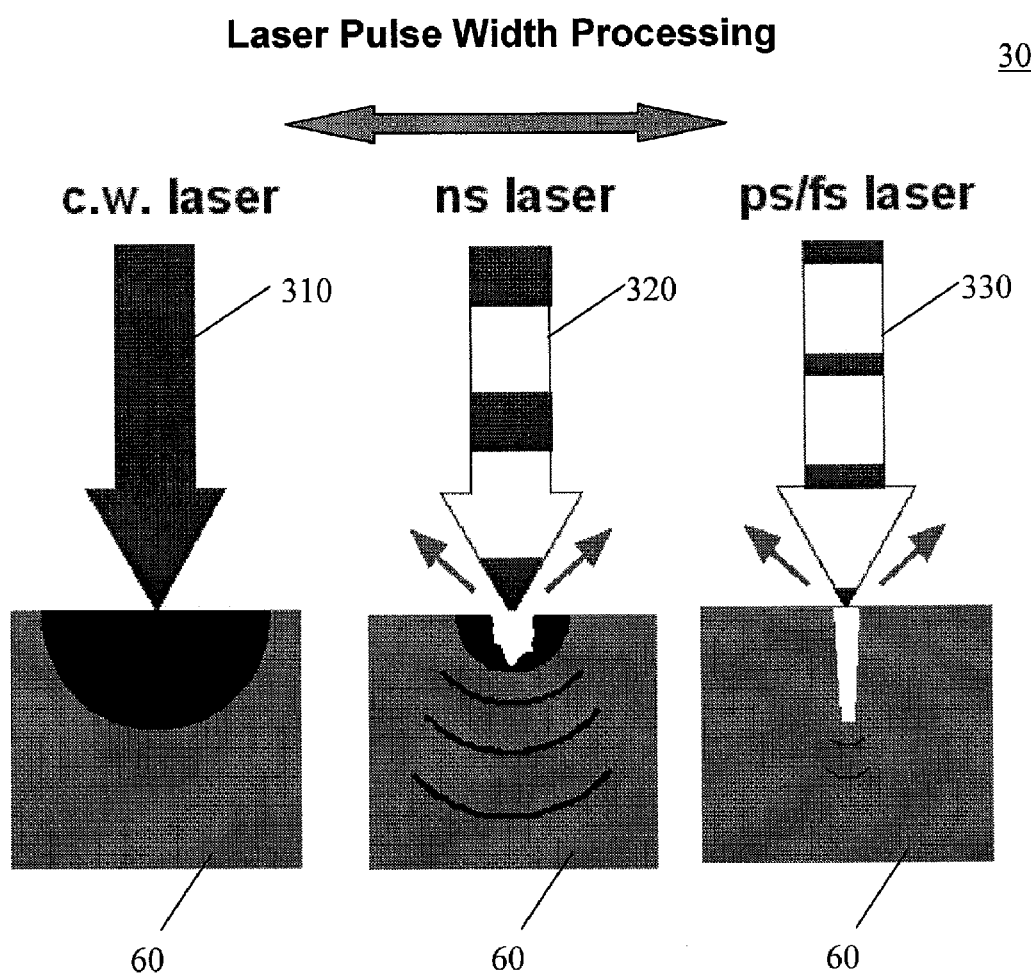
FIG. 3 is an illustration of the effects of laser pulse width in accordance with an embodiment of the disclosure.

As an example of the effect of focused laser scanning, FIG. 3 is an illustration of the effects of laser pulse width processing 300 on substrate 60, and any devices being fabricated therein, in accordance with an embodiment of the disclosure. Substrate 60 may be subjected to laser pulses of various pulse widths. As an example, we consider that each pulse has the same total energy in a given repetition period and the same spot size 50, so that longer pulses have low peak power and density and, conversely, shorter pulses have higher peak power and density. Considering that the pulse width can potentially vary by as much as 11 orders of magnitude, a considerable range of processing possibilities may exist.

At one extreme, the laser may be operating in continuous wave (c.w.) mode 310. Therefore, the peak and average power may be quite low. In this case, a thermal impulse may result in a certain degree of thermal heating that may range from having a negligible effect to being sufficient to cause a process such as annealing or local melting. In the case of a laser pulse of nanosecond (ns) duration 320, the peak power may be correspondingly higher, under the exemplary conditions being assumed. The thermal impulse produced may result in ablative removal, for example, of photo-resist or other deposited material, such as a metallic trace. In addition, the pulse width may be such that thermo-elastic effects result in producing a shock wave that couples to elastic wave generation into substrate 60 as a further means of dissipating the energy deposited by beam 10. In the case of picosecond (ps) or femtosecond (fs) pulses 330, the peak power may be so high and the pulse width so narrow that energy is dissipated in processes such as via drilling of narrow holes with production of ablative material, for example, to enable contact between subsurface layers of substrate 60 and top surface layers currently existing or layers deposited on substrate 60 in subsequent steps. In this case the pulse width may be too short to effectively couple significant energy into elastic waves, and the efficiency of the process effect may thereby be improved.

Figure 4:
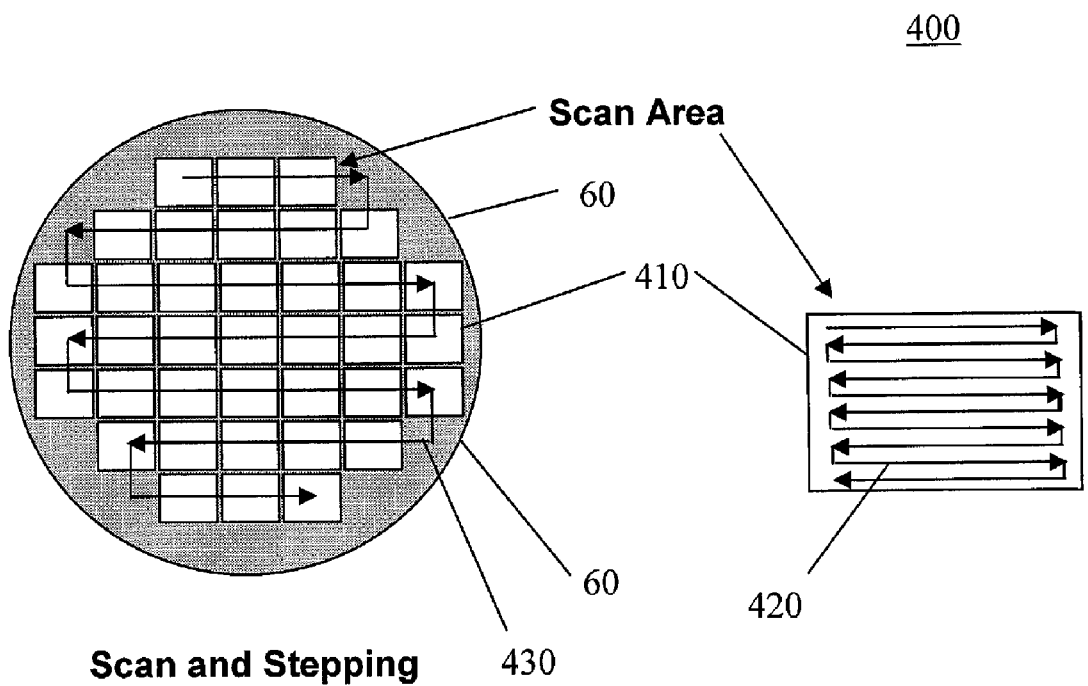
FIG. 4 is an illustration of scanning and stepping in accordance with an embodiment of the disclosure.

FIG. 4 is a drawing illustrating scanning and stepping 400 in accordance with an embodiment of the disclosure. Substrate 60 may contain a plurality of segments 410. Within a single segment 410, substrate scanning system 100 may generate a scanning path 420, such as a raster scan, for focused spot 50 to follow, as well as control various other parameters introduced above, such as the size of focused spot 50, pulse width, duty cycle, peak power, and total pulse energy under the direction of a processor and controller (both not shown, discussed below). Upon completion of scanning path 420 in a first one of segment 410, substrate 60 may be repositioned, i.e., stepped, to locate a second one of segment 410 in the optimal center of the field of view of scanning system 100 and the process repeated, until all selected segments 410 have been scanned and the process effect achieved in each selected segment 410. A stepping path 430 may be provided by the substrate processing station to position substrate 60 accordingly. Stepping path 430 may be an approximate raster scan, as shown, or other suitable stepping or scanning pattern.

Figure 5:
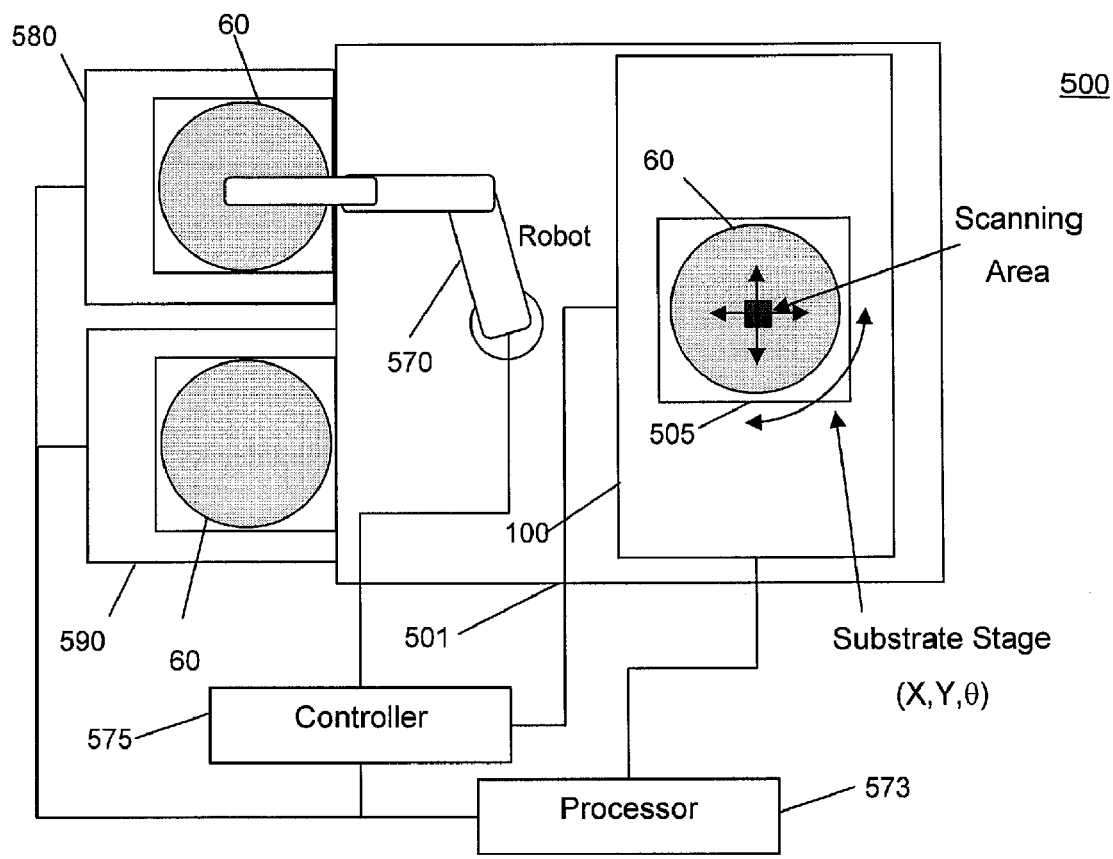
FIG. 5 is an illustration of a substrate processing station in accordance with an embodiment of the disclosure.

FIG. 5 is an illustration of an exemplary substrate processing station 500 in accordance with an embodiment of the disclosure. Substrate processing station 500 includes substrate scanning system 100 and a sample handling system 501. Substrate processing station 500 further includes a sample handler 570, such as a robot arm, for example, a sample delivery cassette system 580, and a sample retrieval cassette system 590. Sample handler 570 acquires substrate 60 from delivery cassette system 580 and places substrate 60 on a substrate stage 505. Substrate stage 505 may be enabled to align substrate 60, or alternatively, an additional substrate alignment/orientation stage (not shown) may be provided separately in sample handling system 501. Alignment/orientation comprises X and Y translation in the focal plane of substrate scanning system 100 and rotation θ about the axis perpendicular to the X-Y plane. Sample handler 570 may also provide for transferring substrate 60 from the alignment stage to substrate stage 505. After substrate processing, substrate 60 is transferred by sample handler 570 from stage 505 to retrieval cassette system 590. Sample handling system 501 components including sample handler 570, delivery cassette system 580, and retrieval cassette system 590, may further be coupled to, and supervised by, a processor 573 and a controller 575. Alignment of substrate 60 may be performed on stage 505, or, alternatively, on a separate sample aligner (not shown) included in sample handling system 501. Sample handler 570 performs sample transport operations, including moving substrate 60 from delivery cassette system 580 to substrate scanning system 100, and then to retrieval cassette system 590. Details of a related sample handling system may be found in commonly-owned U.S. Pat. No. 6,568,899, entitled "Wafer Processing System Including a Robot", which is incorporated by reference in its entirety.

In implementations, the above described techniques and their variations may be implemented at least partially as computer software instructions operational in processor 573 and controller 575. Such instructions may be stored on one or more machine-readable storage media or devices and are executed by, e.g., one or more computer processors, or cause the machine, to perform the described functions and operations. Processor 573 may generate scripts to control all components of exemplary substrate processing station 500. For example, the script may generate a set of scanning path 420 commands within segment 410, and an X-Y translation and/or θ rotation commands to substrate stage 505, typically via controller 575. Furthermore, focused laser beam processing may be accomplished by a simultaneous combination of operations of substrate scanning system 100 and substrate stage 505 under direction from processor 573. Additional control processes may be contemplated within the scope of the disclosure.

Also, only those claims which use the word "means" are intended to be interpreted under 35 USC 112, sixth paragraph. Moreover, no limitations from the specification are intended to be read into any claims, unless those limitations are expressly included in the claims. Accordingly, other embodiments are within the scope of the following claims. For example, the above describes certain methods for laser scanning; however, any suitable laser beam scanning mechanism may be used including vibrating mirrors, rotating mirrors, galvo mirror systems, and/or piezo micro position control systems.

What is claimed is:

1. A method of processing semiconductor materials and devices comprising:
   providing a laser beam of a selected wavelength and a selected peak power;
   modulating the laser beam to provide pulses of a discrete pulse width;
   focusing the laser beam at a surface plane of a semiconductor material;
   controlling to a selected value the total energy in each laser pulse;
   scanning the laser beam in a programmed pattern over the surface of the semiconductor material; and
   altering the semiconductor material.

2. The method of claim 1, wherein the selected wavelength is approximately between 140 nanometers and 3 micrometers.

3. The method of claim 1, wherein the discrete pulse width is approximately between 10 femtoseconds and 100 milliseconds.

4. The method of claim 1, wherein the modulating comprises selecting a pulse repetition rate to provide a selected average power delivered in the laser beam to the surface of the semiconductor material.

5. The method of claim 4, wherein the selecting the pulse repetition rate comprises selecting a duty cycle between 0.1% and 95%.

6. The method of claim 1, wherein the focusing comprises forming an effective beam diameter approximately between 0.1 micrometer and 1 millimeter.

7. The method of claim 1, wherein the total energy per pulse selected is between 1 micro-Joule and 1 Joule.

8. The method of claim 1, wherein the scanning comprises:
   providing a first scanning area of the surface of the semiconductor material;
   directing the focused laser beam along a first programmed path within the first scanning area;
   blocking the focused laser beam upon completion of scanning the first scanning area;
   providing a second scanning area of the surface of the semiconductor material; and
   directing the focused laser beam along a second programmed path within the second scanning area.

9. The method of claim 8, wherein the area of the first and second scanning areas is between 7840 nanometer$^2$ and 400 cm$^2$.

10. The method of claim 1, wherein the altering comprises processes selected from the group consisting of annealing, implant activation, dopant diffusion control, deposition, thin film formation, chemical reaction, curing, baking, and material modification.

11. The method of claim 8, wherein the first and second programmed paths are the same.

12. The method of claim 11, wherein the programmed pattern comprises the first and second programmed paths and a path for scanning a plurality of scanning areas on the surface of the semiconductor material.

13. The method of claim 12, wherein the plurality of scanning areas comprises the entire surface of the semiconductor material.

14. A sample processing system, comprising:
   a sample scanning system adapted to direct a focused laser beam to a sample;
   a sample delivery system;
   a sample retrieval system;
   a sample handling system adapted to transfer samples from the sample delivery system to the sample scanning system and from the sample scanning system to the sample retrieval system;
   a controller adapted to control operations of the sample delivery system, the sample retrieval system, the sample handling system, and the sample scanning system; and
   a processor adapted to interface with the controller, the sample delivery system, the sample retrieval system, the sample handling system, and the sample scanning system, wherein the processor provides instructions to the controller and generates a processing script for all operations of the processing system.

15. The system of claim 14, wherein the laser beam has a wavelength between 140 nanometers and 3 micrometers.

16. The system of claim 14, wherein the laser beam has a pulse width between 10 femtoseconds and 100 milliseconds.

17. The system of claim 14, wherein the laser beam has a selected pulse repetition rate and a duty cycle of between 0.1% and 95%.

18. The system of claim 14, wherein the laser beam has a selected total energy per pulse between 1 micro-Joule and 1 Joule.

19. The system of claim 14, wherein the sample scanning system further comprises:
   a first mirror galvanometer, wherein the first mirror galvanometer is adapted to scan the laser beam in a first scanning direction;
   a second mirror galvanometer, wherein the second mirror galvanometer is adapted to scan the laser beam in a second scanning direction, the second scanning direction being substantially perpendicular to the first scanning direction; and
   a flat field lens system adapted to focus the scanned laser beam to a selected spot size at a sample focal plane.

20. The system of claim 19, wherein the spot size of the focused laser beam is between 7840 nanometer$^2$ and 400 cm$^2$.

21. A method of semiconductor processing comprising:
focusing a laser beam to a specific beam width; and
scanning the focused laser beam across a surface of a semiconductor material to alter the semiconductor material.

22. The method of claim 21, wherein the scanning comprises:
scanning a first portion of the surface; and
scanning a second portion of the surface upon completing scanning the first portion.

23. The method of claim 22, wherein the scanning the first and second portions is a raster scan.

24. The method of claim 21, further comprising modulating the laser beam prior to the scanning.

25. The method of claim 21, wherein the altering comprises processes selected from the group consisting of annealing, implant activation, dopant diffusion control, deposition, thin film formation, doping, chemical reaction, stress control, curing, baking, and material modification.

* * * * *